(12) United States Patent
Sun et al.

(10) Patent No.: US 11,508,176 B2
(45) Date of Patent: Nov. 22, 2022

(54) DISPLAY SUBSTRATE AND METHOD FOR MANUFACTURING THE SAME, DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Wen Sun, Beijing (CN); Zhen Zhang, Beijing (CN); Wei Deng, Beijing (CN); Daniel Youn, Beijing (CN); Yiyang Zhang, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 458 days.

(21) Appl. No.: 16/514,774

(22) Filed: Jul. 17, 2019

(65) Prior Publication Data

US 2020/0026899 A1 Jan. 23, 2020

(30) Foreign Application Priority Data

Jul. 17, 2018 (CN) .......................... 201810786405.0

(51) Int. Cl.
*G06V 40/13* (2022.01)
*H01L 51/56* (2006.01)

(52) U.S. Cl.
CPC .......... *G06V 40/1318* (2022.01); *H01L 51/56* (2013.01); *G09G 2300/0426* (2013.01)

(58) Field of Classification Search
CPC ............. G06K 9/0004; G06V 40/1318; G06V 40/1234
See application file for complete search history.

(56) References Cited

U.S. PATENT DOCUMENTS

2004/0201072 A1 10/2004 Rhodes
2017/0017824 A1* 1/2017 Smith .................... G02B 6/005
(Continued)

FOREIGN PATENT DOCUMENTS

CN 1802750 A 7/2006
CN 105702683 A 6/2016
(Continued)

OTHER PUBLICATIONS

First Office Action issued in corresponding Chinese Application No. 201810786405.0, dated May 21, 2020, with English language translation.
(Continued)

*Primary Examiner* — Joseph R Haley
(74) *Attorney, Agent, or Firm* — McDermott Will & Emery LLP

(57) ABSTRACT

A display substrate having a fingerprint recognition region includes an array substrate, and a light shielding layer disposed at a side of the array substrate and at least located in the fingerprint recognition region. The material of the light shielding layer is an insulating material. A portion of the light shielding layer located in the fingerprint recognition region is provided with a plurality of light transmission holes, and each of the plurality of light transmission holes is configured to provide a transmission channel for fingerprint imaging light.

12 Claims, 5 Drawing Sheets

(56) References Cited

U.S. PATENT DOCUMENTS

| | | | |
|---|---|---|---|
| 2018/0031742 A1* | 2/2018 | Lai | G02B 5/003 |
| 2018/0305509 A1* | 10/2018 | Yun | G02B 1/04 |
| 2019/0073509 A1* | 3/2019 | Chien | G02F 1/133553 |
| 2019/0156097 A1 | 5/2019 | Liu et al. | |
| 2019/0172886 A1 | 6/2019 | Ma et al. | |
| 2019/0172887 A1 | 6/2019 | Sun et al. | |
| 2019/0180073 A1 | 6/2019 | Zhang et al. | |
| 2019/0294849 A1* | 9/2019 | Ma | G06F 3/0412 |

FOREIGN PATENT DOCUMENTS

| | | |
|---|---|---|
| CN | 106298859 A | 1/2017 |
| CN | 106449656 A | 2/2017 |
| CN | 107390926 A | 11/2017 |
| CN | 107977632 A | 5/2018 |
| CN | 107978624 A | 5/2018 |
| CN | 107994034 A | 5/2018 |

OTHER PUBLICATIONS

Second Office Action dated Nov. 30, 2020, in corresponding Chinese Application No. 201810786405.0, with English language translation.

Third Office Action dated Jan. 22, 2021, in corresponding Chinese Application No. 201810786405.0, with English language translation.

Notification of the Fourth Office Action isused in Chinese Patent Application No. 201810786405.0, dated Oct. 9, 2021; with English translation.

* cited by examiner

DISPLAY SUBSTRATE AND METHOD FOR MANUFACTURING THE SAME, DISPLAY APPARATUS

This application claims priority to Chinese Patent Application No. 201810786405.0, filed with the Chinese Patent Office on Jul. 17, 2018, titled "DISPLAY SUBSTRATE AND METHOD FOR MANUFACTURING THE SAME, DISPLAY PANEL", which is incorporated herein by reference in its entirety.

TECHNICAL FIELD

The present disclosure relates to the field of display technologies, and in particularly, to a display substrate, a method for manufacturing the same and a display apparatus.

BACKGROUND

With the development of display technologies, using an under-screen fingerprint recognition technology in display products is not only convenient for users to use, but also beneficial to realize full screen of the display products (i.e., narrow frame or frameless).

SUMMARY

In one aspect, a display substrate having a fingerprint recognition region is provided. The display substrate includes: an array substrate, and a light shielding layer disposed at a side of the array substrate and at least located in the fingerprint recognition region. The material of the light shielding layer is an insulating material. A portion of the light shielding layer located in the fingerprint recognition region is provided with a plurality of light transmission holes, and each of the plurality of light transmission holes is configured to provide a transmission channel for fingerprint imaging light.

In some embodiments, the display substrate further includes a plurality of fingerprint acquisition devices disposed at a side of the array substrate away from the light shielding layer. Each of the plurality of fingerprint acquisition devices is corresponding to at least one of the plurality of light transmission holes, and each fingerprint acquisition device is configured to collect the fingerprint imaging light transmitting through at least one corresponding light transmission hole.

In some embodiments, the display substrate further includes an electrode layer disposed at a side of the light shielding layer away from the array substrate. The electrode layer is provided with a plurality of openings. An orthographic projection of each of the plurality of light transmission hole on the array substrate is within an orthographic projection of one corresponding opening of the plurality of openings on the array substrate.

In some embodiments, the electrode layer is lightproof.

In some embodiments, the array substrate includes a base substrate, and a plurality of thin film transistors disposed on a surface of the base substrate facing the light shielding layer. The electrode layer includes a plurality of first electrodes. Each of the plurality of first electrodes is electrically connected to one corresponding thin film transistor of the plurality of thin film transistors.

In some embodiments, the display substrate further includes a luminescent material pattern disposed at a side of each first electrode away from the light shielding layer so that there are a plurality of luminescent material patterns; and a second electrode disposed at a side of each luminescent material pattern away from the first electrode so that there are a plurality of second electrodes.

In some embodiments, the plurality of second electrodes are electrically connected with each other, or the plurality of second electrodes have an integrated structure. The plurality of second electrodes are transparent, or the integrated second electrode is transparent.

In some embodiments, the display substrate further includes a first planar layer disposed between the light shielding layer and the electrode layer.

In some embodiments, the array substrate includes a base substrate, and a plurality of thin film transistors disposed on the base substrate. The light shielding layer covers on surfaces of the plurality of thin film transistors away from the base substrate, and the light shielding layer is configured to planarize sides of the plurality of thin film transistors away from the base substrate.

In some embodiments, the material of the light shielding layer includes polyimide having light transmittance being less than or equal to 10%.

In some embodiments, the display substrate further includes a second planar layer disposed between the array substrate and the light shielding layer. The material of the light shielding layer includes photosensitive resin having light transmittance being less than or equal to 10%.

In some embodiments, the display substrate further includes a third planar layer disposed on a surface of the light shielding layer away from the second planar layer. An orthographic projection of the second planar layer on the array substrate overlaps with an orthographic projection of the third planar layer on the array substrate.

In another aspect, a method for manufacturing a display substrate which has a fingerprint recognition region is provided. The method includes: manufacturing an array substrate; forming a light shielding layer at a side of the array substrate by using an insulating material and the light shielding layer being at least located in the fingerprint recognition region; and forming a plurality of light transmission holes in a portion of the light shielding layer located in the fingerprint recognition region and providing a transmission channel for fingerprint imaging light by each of the plurality of light transmission holes.

In some embodiments, manufacturing the array substrate includes: providing a base substrate; and manufacturing a plurality of thin film transistors on the base substrate. Forming a light shielding layer at a side of the array substrate by using an insulating material includes: forming the light shielding layer on surfaces of the plurality of thin film transistors away from the base substrate by using polyimide having light transmittance being less than or equal to 10%. Forming a plurality of light transmission holes in a portion of the light shielding layer located in the fingerprint recognition region includes: forming the plurality of light transmission holes in the portion of the light shielding layer located in the fingerprint recognition region and at least one via hole each of which is corresponding to a thin film transistor of the array substrate, by means of a first mask, by an exposure process and a development process.

In some embodiments, the method for manufacturing the display substrate further includes forming a first planar film on a surface of the light shielding layer away from the array substrate, and patterning the first planar film, by means of a second mask, by an exposure process and a development process to obtain a first planar layer having at least one via hole each of which is corresponding to a thin film transistor of the array substrate. An orthographic projection of each via hole of the first planar layer on the array substrate overlaps with an orthographic projection of each via hole of the light shielding layer on the array substrate, and does not overlap with an orthographic projection of any light transmission hole of the light-shielding layer on the array substrate.

In some embodiments, the method for manufacturing the display substrate further includes forming a second planar film on the array substrate and patterning the second planar film, by means of a third mask, by an exposure process and a development process to obtain a second planar layer having at least one via hole before forming a light shielding layer at a side of the array substrate by using an insulating material. Each of the at least one via hole of the second planar layer is corresponding to a thin film transistor of the array substrate. Forming a light shielding layer at a side of the array substrate by using an insulating material includes: forming the light shielding layer on the surface of the second planar layer away from the array substrate by using photosensitive resin having light transmittance being less than or equal to 10%. Forming a plurality of light transmission holes in a portion of the light shielding layer located in the fingerprint recognition region includes: forming the plurality of light transmission holes in the portion of the light shielding layer located in the fingerprint recognition region and at least one via hole each of which is corresponding to a thin film transistor of the array substrate, by means of a fourth mask, by an exposure process and a development process. An orthographic projection of each via hole of the second planar layer on the array substrate overlaps with an orthographic projection of each via hole of the light shielding layer on the array substrate, and does not overlap with an orthographic projection of any light transmission hole of the light-shielding layer on the array substrate.

In some embodiments, the method for manufacturing the display substrate further includes: forming a third planar film on a surface of the light shielding layer away from the second planar layer, and patterning the third planar film, by means of a third mask, by an exposure process and a development process to obtain a third planar layer having at least one via hole. Each of the at least one via hole of the third planar layer is corresponding to a thin film transistor of the array substrate. An orthographic projection of each via hole of the third planar layer on the array substrate overlaps with an orthographic projection of each via hole of the light shielding layer on the array substrate, and does not overlap with an orthographic projection of any light transmission hole of the light-shielding layer on the array substrate.

In some embodiments, the method for manufacturing the display substrate further includes: forming a plurality of fingerprint acquisition devices at a side of the array substrate away from the light shielding layer. Each of the plurality of fingerprint acquisition devices is corresponding to at least one of the plurality of light transmission holes, and each fingerprint acquisition device is configured to collect fingerprint imaging light transmitting through at least one corresponding light transmission hole.

In some embodiments, the method for manufacturing the display substrate further includes forming an electrode layer at a side of the light shielding layer away from the array substrate; and forming a plurality of openings in the electrode layer. An orthographic projection of each of the plurality of light transmission holes on the array substrate is within an orthographic projection of one corresponding opening of the plurality of openings on the array substrate.

In yet another aspect, a display apparatus is provided. The display apparatus includes the display substrate as described in some embodiments above.

BRIEF DESCRIPTION OF THE DRAWINGS

In order to describe technical solutions in embodiments of the present disclosure more clearly, the accompanying drawings to be used in the description of disclosure will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

The technical solutions in some embodiments of the present disclosure will be described clearly and completely with reference to the accompanying drawings in some embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

Terms "first", "second" and "third" are used for descriptive purposes only and are not to be construed as indicating or implying the relative importance or implicitly indicating the number of indicated technical features. Thus, features defined as "first", "second" and "third" may explicitly or implicitly include one or more of the features. In the description of the present disclosure, "a plurality of/the plurality of" means two or more unless otherwise specified. The term "and/or" placed between a first entity and a second entity includes any of the meanings of (1) only the first entity, (2) only the second entity, and (3) the first entity and the second entity.

Figure 1:
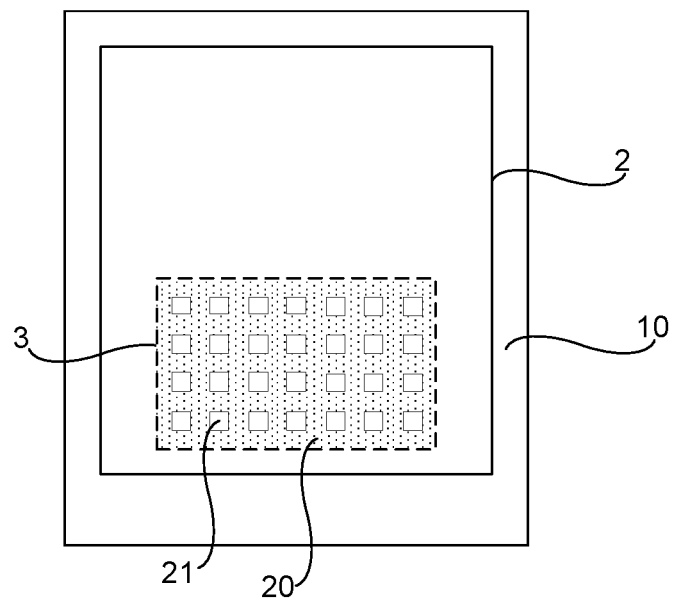
FIG. 1 is a schematic vertical view of a display substrate according to some embodiments of the present disclosure.
Figure 2:
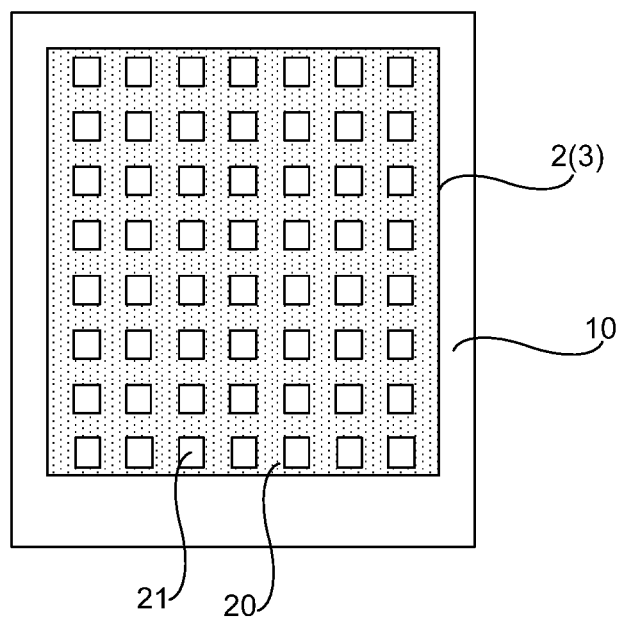
FIG. 2 is a schematic vertical view of another display substrate according to some embodiments of the present disclosure.

Some embodiments of the present disclosure provide a display substrate. As shown in FIG. 1 and FIG. 2, the display substrate has a fingerprint recognition region 3. The display substrate further has a display area 2. The fingerprint recognition region 3 of the display substrate overlaps with the display area 2, or the fingerprint recognition region 3 is within the display area 2. However, the position of the fingerprint recognition region 3 in the display substrate can be selectively set according to actual needs, which is not limited in some embodiments of the present disclosure. In some examples, as shown in FIG. 2, the fingerprint recognition region 3 overlaps with the display area 2. Thus, in a case where the display substrate is applied to a display apparatus, the fingerprint recognition can be performed at any position of the display area 2 of the display apparatus, thereby improving user experience.

As shown in FIG. 1 and FIG. 2, the display substrate includes an array substrate 10, and a light shielding layer 20 disposed at a side of the array substrate 10 and at least located in the fingerprint recognition region 3. The material of the light shielding layer 20 is an insulating material. A portion of the light shielding layer 20 located in the fingerprint recognition region 3 is provided with a plurality of light transmission holes 21, and each of the plurality of light transmission holes 21 is configured to provide a transmission channel to fingerprint imaging light 4.

The light shielding layer 20 is formed by using an insulating material. The light shielding layer 20 can be used as an insulating layer in the display substrate while the light shielding layer 20 blocks light for each of the thin film transistors 12 in the array substrate 10, thereby reducing the number of insulating layers in the display substrate and further reducing the number of masks used in the manufacturing process of the display substrate, which is advantageous to improve productivity and reduce cost. In addition, compared with the formation of the light shielding layer 20 by using metal material, the manufacturing process of the light shielding layer 20 formed by using insulating material (especially a photosensitive insulating material) is simple and easy to implement.

Figure 3:
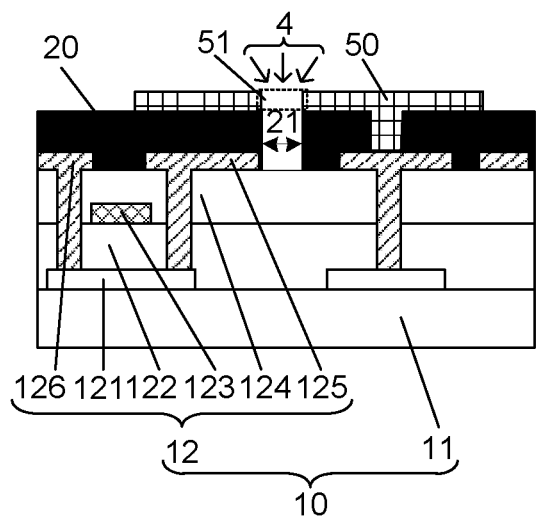
FIG. 3 is a schematic cross-sectional view of a part of a display substrate according to some embodiments of the present disclosure.
Figure 4:
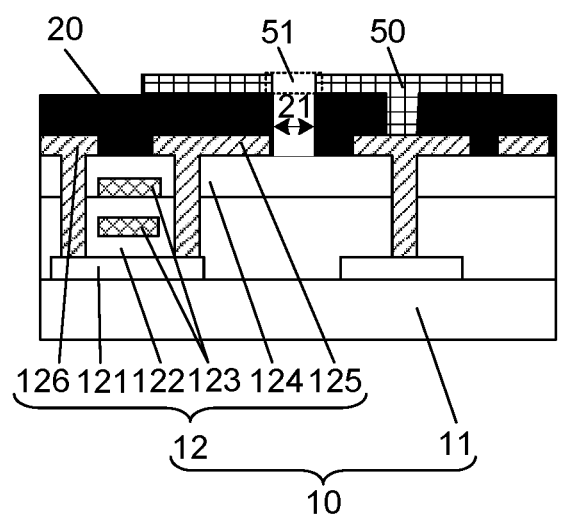
FIG. 4 is a schematic cross-sectional view of a part of another display substrate according to some embodiments of the present disclosure.

In some embodiments, referring to FIG. 3 and FIG. 4, the array substrate 10 includes a base substrate 11 and a plurality of thin film transistors (TFT) 12 disposed on the base substrate 11. The material of the base substrate 11 and the number and the structure of the thin film transistors in the array substrate 10 can be set according to actual needs, which is not limited in some embodiments of the present disclosure.

For example, the base substrate 11 is a flexible substrate. The material of the flexible substrate is at least one of polyimide, polycarbonate, polyethylene, polyethylene terephthalate and polyacrylate. Thus, the display substrate is a flexible display substrate, which is convenient to apply in a flexible display apparatus.

For example, as shown in FIG. 3, each thin film transistor 12 includes a semiconductor layer 121, a gate insulating layer 122, a gate 123, an interlayer insulating layer 124, a source 125, and a drain 126. Herein, the semiconductor layer 121, the gate insulating layer 122, the gate 123 and the interlayer insulating layer 124 are sequentially stacked in a direction away from the base substrate 10, and the source 125 and the drain 126 are located on a surface of the interlayer insulating layer 124 away from the gate 123 and electrically connected to the semiconductor layer 121. However, in a case where the thin film transistor 12 is a double gate transistor, as shown in FIG. 4, two gates 123 are disposed in the thin film transistor 12, and the two gates 123 are insulated by the gate insulating layer 122.

In addition, for example, the array substrate 10 further includes a plurality of capacitors disposed on the base substrate 11. The display substrate further includes a plurality of subpixels, and a pixel driving circuit corresponding to each subpixel in the array substrate 10 includes at least one thin film transistor and at least one capacitor.

Each light transmission hole 21 is configured to provide a transmission channel to the fingerprint imaging light 4, that is, the fingerprint imaging light 4 can be transmitted through at least one of the plurality of light transmission holes 21 and form images by using the at least one light transmission hole 21. Some embodiments of the present disclosure do not limit the number, the shape and the arrangement mode of the light transmission holes 21 in the light shielding layer 20, as long as it is sufficient to perform fingerprint imaging through each light transmission hole 21. In some examples, the light transmission holes 21 are circular holes, rectangular holes or square holes, which is convenient for manufacture. In some other examples, the light transmission holes 21 are rhombic holes, hexagonal holes or irregularly shaped holes. In some examples, the plurality of light transmission holes 21 are evenly arranged in an array form, which is advantageous for improving the accuracy of fingerprint recognition.

Figure 8:
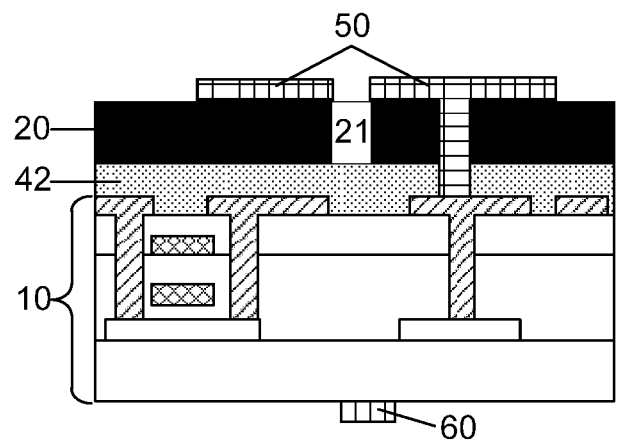
FIG. 8 is a schematic cross-sectional view of a part of yet another display substrate according to some embodiments of the present disclosure.
Figure 9:
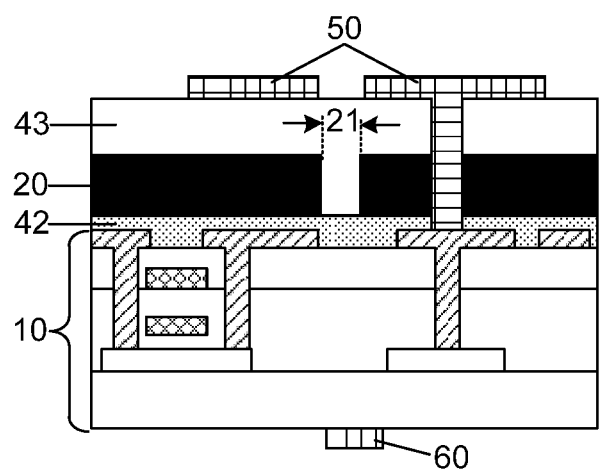
FIG. 9 is a schematic cross-sectional view of a part of yet another display substrate according to some embodiments of the present disclosure.
Figure 10:
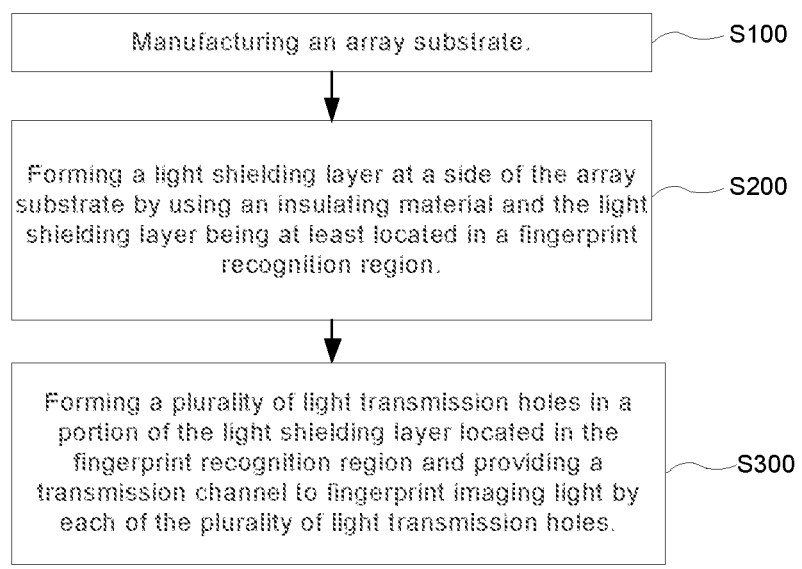
FIG. 10 is a flow chart of a method for manufacturing a display substrate according to some embodiments of the present disclosure.

In some embodiments, referring to FIG. 8 and FIG. 9, the display substrate further includes a plurality of fingerprint acquisition devices 60 disposed at a side of the array substrate 10 away from the light shielding layer 20. Each fingerprint acquisition device 60 of the plurality of fingerprint acquisition devices 60 corresponds to at least one light transmission hole 21 of the plurality of light transmission holes 21, and each fingerprint acquisition device 60 is configured to collect fingerprint imaging light 4 transmitting through at least one corresponding light transmission holes 21.

Based on this, in some embodiments of the present disclosure, the display substrate is provided with a fingerprint recognition function, and the acquisition and imaging of fingerprints use a principle of pinhole imaging. For example, a finger is pressed on a side of the display substrate on which the light shielding layer 20 is disposed, the light from the display substrate and/or the ambient light is irradiated onto the finger to be diffusely reflected, and the reflected light (ie, the fingerprint imaging light 4) passing through the at least one light transmission hole 21 in the light shielding layer 20 is projected on the at least one corresponding fingerprint acquisition device 60 in the principle of aperture imaging. In this way, the at least one fingerprint acquisition device 60 photoelectrically converts the received projection to perform the fingerprint recognition, that is, to identify ridge lines and valley lines of the fingerprint.

In addition, the number and the position of the fingerprint acquisition device 60 in the display substrate can be set according to actual needs. Some embodiments of the present disclosure provide the plurality of fingerprint acquisition devices 60 on the side of the array substrate 10 away from the light shielding layer 20, which is beneficial to the integration of the fingerprint acquisition devices 60 in the display substrate, that is, improving the integration level of the display substrate. Therefore, in some embodiments of the present disclosure, the display substrate realizes under-screen fingerprint recognition, which is not only beneficial to compressing the size of the frame of the display substrate to achieve full screen of display products, but also ensures that the display substrate has the advantages of oil resistance, water resistance and dust resistance.

In some embodiments, referring to FIG. 3 and FIG. 4, the display substrate further includes an electrode layer 50 disposed at a side of the light shielding layer 20 away from the array substrate 10 (FIG. 3 and FIG. 4 only show a portion of the electrode layer 50). The electrode layer 50 is provided with a plurality of openings 51. An orthographic projection of each light transmission hole 21 of the plurality of light transmission holes 21 on the array substrate 10 is within an orthographic projection of one corresponding opening 51 of the plurality of openings 51 on the array substrate 10.

The electrode layer 50 is usually formed by using a conductive material. In some examples, the electrode layer 50 is formed by using a metal material, and the electrode layer 50 is lightproof. That is, in a case where the electrode layer 50 is provided at the side of the light shielding layer 20 away from the array substrate 10, the electrode layer 50 needs to be hollowed out to ensure that the portion of the electrode layer 50 facing each light transmission hole 21 has an opening 51, thereby facilitating the fingerprint imaging light 4 passing through the at least one opening 51 of the electrode layer 50 into the corresponding light transmission hole(s) 21. Herein, the fact that the electrode layer 50 is lightproof means that the light transmittance of the electrode layer 50 is less than or equals to 10% (including 0), that is, the reflectance of the light after being irradiated to the electrode layer 50 is greater than or equals to 90%.

Figure 5:
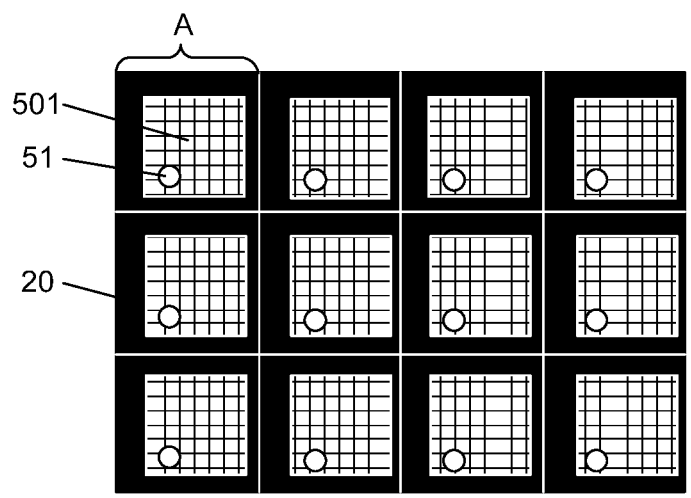
FIG. 5 is a schematic vertical view of a part of a display substrate according to some embodiments of the present disclosure.

In some embodiments, referring to FIG. 5, the display substrate includes a plurality of subpixels A, and the electrode layer 50 includes a plurality of first electrodes 501. A first electrodes 501 is disposed in each subpixel A. In a case where each subpixel A corresponds to a light transmission hole 21, the portion of each first electrode 501 facing the light transmission hole 21 is provided with an opening 51. Each subpixel A also corresponds to a pixel driving circuit, each pixel driving circuit includes at least one thin film transistor 12, and the first electrode 501 of each subpixel A is electrically connected to a thin film transistor 12 (i.e., a driving transistor) in the pixel driving circuit corresponding to the same subpixel A.

Figure 6:
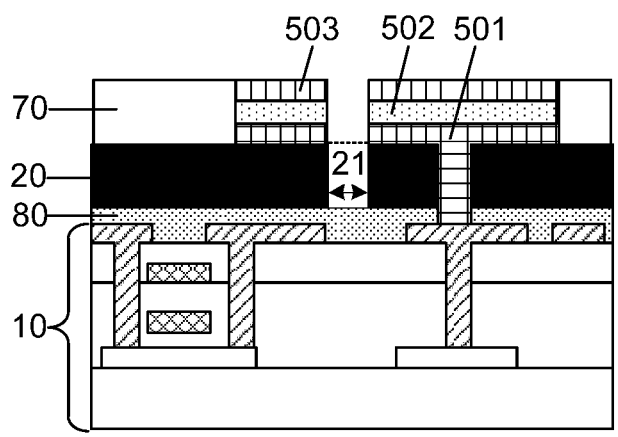
FIG. 6 is a schematic cross-sectional view of a part of yet another display substrate according to some embodiments of the present disclosure.

For example, the display substrate is an Organic Light-Emitting Diode (OLED) display substrate or a Quantum Dot Light Emitting Diodes (QLED) display substrate. Referring to FIG. 6, the display substrate further includes a luminescent material pattern 502 disposed at a side of each of the first electrodes 501 away from the light shielding layer 20, and a second electrode 503 disposed at a side of each luminescent material pattern 502 away from the first electrodes 501. A plurality of second electrodes 503 in the plurality of subpixels are electrically connected with each other or have an integrated structure, which is advantageous for simplifying the manufacturing process. The plurality of second electrodes 503 is able to form an integrated second electrode when they have an integrated structure. In some examples, each of the second electrodes 503 is transparent or the integrated second electrode 503 is transparent, that is, the light transmittance of each of the second electrodes 503 or the light transmittance of the integrated second electrode 503 is greater than or equals to 90%.

Referring to FIG. 6, the display substrate further includes a pixel defining layer 70 disposed at the side of the light shielding layer 20 away from the array substrate 10. The pixel defining layer 70 has a plurality of openings configured to define the plurality of subpixels, that is, the first electrodes 501, the luminescent material patterns 502, and the second electrodes 503 are sequentially stacked in each opening of the pixel defining layer 70 in the direction away from the array substrate 10. In some examples, the material of the second electrodes 503 is a metal material such as magnesium, silver or aluminum. The thickness of the second electrodes 503 needs to be set according to actual needs to ensure that it can transmit light. However, in the case where the first electrodes 501 are lightproof and the second electrodes 503 are transparent, a luminescent device composed of the first electrodes 501, the luminescent material patterns 502, the second electrodes 503, and the like can generate light reflection based on the microcavity effect between the first electrodes 501 and the second electrodes 503, thereby increasing the light exitance of the corresponding light emitting device. In some examples, the light emitted by the luminescent device composed of the first electrodes 501, the luminescent material patterns 502, the second electrodes 503, and the like, and/or the ambient light can be reflected by a finger, and the reflected light is the fingerprint imaging light 4.

In some embodiments, referring to FIG. 6, at least one light-transmitting film 80 is disposed on surfaces of the plurality of thin film transistors 12 of the array substrate 10 away from the base substrate 11. The light shielding layer 20 is disposed at a side of the array substrate 10, and the light shielding layer 20 is disposed on a surface of the at least one light-transmitting film 80 away from the base substrate 11. The at least one light-transmitting film 80 is formed by using a light transmissive material, and the at least one light-transmitting film 80 includes at least one layer selected from a group consisting of a passivation layer, an insulating layer, and a planar layer. For example, in some practices, the at least one light-transmitting film 80 can be realized as a second planar layer 42 which is described below.

Figure 7:
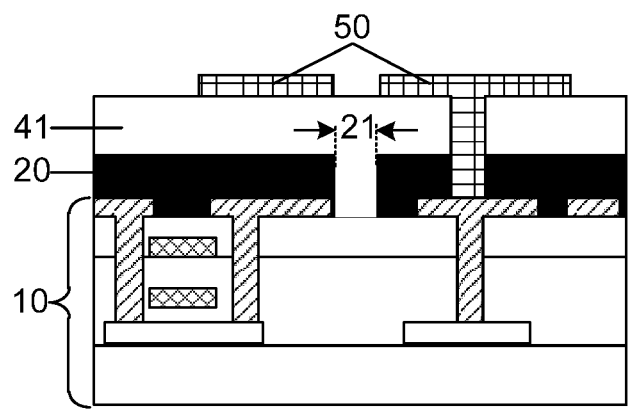
FIG. 7 is a schematic cross-sectional view of a part of yet another display substrate according to some embodiments of the present disclosure.

In other embodiments, referring to FIG. 7, the light shielding layer 20 is disposed at a side of the array substrate 10, and the light shielding layer 20 is disposed on surfaces of the plurality of thin film transistors 12 of the array substrate 10 away from the base substrate 11. That is, the light shielding layer 20 covers on the surfaces of the plurality of thin film transistors 12 away from the base substrate 11 and directly contacts with the plurality of thin film transistors 12. The light shielding layer 20 is configured to planarize sides of the plurality of thin film transistors 12 away from the base substrate 11. Based on this, it is not necessary to make a planar layer between the light shielding layer 20 and the plurality of thin film transistors 12, so that an additional mask is not required to fabricate the planar layer, that is, the number of masks can be reduced during the manufacturing process of the display substrate, thereby increasing productivity and reducing cost.

Referring to FIG. 7, in some examples, the material of the light shielding layer 20 includes polyimide (PI) having light transmittance being less than or equal to 10%, such as black or dark polyimide. In this way, it can ensure that the light shielding layer 20 has a good light shielding effect, and the light shielding layer 20 provides a light preventing protection to the array substrate 10 during the subsequent manufacturing process of the display substrate, for example, reducing the influence of illumination on the performance of the thin film transistors 12 in the array substrate 10. Moreover, in the manufacturing process of the light shielding layer 20, a plurality of light transmission holes 21 are formed in the portion of the light shielding layer 20 located in the fingerprint recognition region 3 by exposure and development processes, which is convenient for manufacture.

Referring to FIG. 7, in some examples, the display substrate further includes a first planar layer 41 disposed between the light shielding layer 20 and the electrode layer

50. Since a plurality of light transmission holes 21 are provided in the light shielding layer 20, in a case where the light shielding layer 20 directly contacts with the plurality of thin film transistors 12 in the array substrate 10, the first planar layer 41 is formed at the side of the light shielding layer 20 away from the array substrate 10, and the electrode layer 50 is formed at a side of the first planar layer 41 away from the light shielding layer 20, which is possible to prevent from the electrode layer 50 shorted with the plurality of thin film transistors 12 in the array substrate 10 passing through the plurality of light transmission holes 21, that is, the two are electrically connected in a region where no electrical connection is required.

In still other embodiments, referring to FIG. 8, the display substrate further includes a second planar layer 42 disposed between the array substrate 10 and the light shielding layer 20. The material of the light shielding layer 20 includes photosensitive resin having light transmittance being less than or equal to 10%, such as black photosensitive resin (black photosensitive resin is a kind of material for making a black matrix). Since the photosensitive resin (especially the black photosensitive resin) contains carbon component, some embodiments of the present disclosure provide the second planar layer 42 between the array substrate 10 and the light shielding layer 20, which is possible to prevent from a micro short occurring in direct contact between the plurality of thin film transistors 12 in the array substrate 10 and the light shielding layer 20.

In addition, the light shielding layer 20 is formed by using photosensitive resin having light transmittance being less than or equal to 10%, which can ensure that the light shielding layer 20 has a good light shielding effect, and the light shielding layer 20 provides a light preventing protection to the array substrate 10 during the subsequent manufacturing process of the display substrate, for example, reducing the influence of illumination on the performance of the thin film transistors 12 in the array substrate 10. Moreover, in the manufacturing process of the light shielding layer 20, the plurality of light transmission holes 21 are formed in the portion of the light shielding layer 20 located in the fingerprint recognition region 3 by exposure and development processes, which is convenient for manufacture.

Referring to FIG. 8, in a case where the light shielding layer 20 is formed by using photosensitive resin having light transmittance being less than or equal to 10%, the electrode layer 50 can be directly formed on a surface of the light shielding layer 20 away from the second planar layer 42, and it is not necessary to form an additional planar layer between the light shielding layer 20 and the electrode layer 50, so that an additional mask is not required to fabricate the additional planar layer. It is advantageous for reducing the number of masks used in the manufacturing process of the display substrate, thereby increasing productivity and reducing cost.

However, referring to FIG. 9, the display substrate can further include a third planar layer 43 disposed on a surface of the light shielding layer 20 away from the second planar layer. That is, on the basis of the display substrate shown in FIG. 8, forming a third planar layer 43 between the light shielding layer 20 and the electrode layer 50 is also allowable. The third planar layer 43 is formed at the side of the light shielding layer 20 away from the array substrate 10, and the electrode layer 50 is formed at a side of the third planar layer 43 away from the light shielding layer 20. In a case that the photosensitive resin forming the shielding layer 20 contains carbon component, it is possible to prevent from a micro short occurring in direct contact between the electrode layer 50 and the light shielding layer 20.

In some examples, an orthographic projection of the second planar layer 42 on the array substrate 10 overlaps with an orthographic projection of the third planar layer 43 on the array substrate 10, which is convenient to use the same mask to form the second planar layer 42 and the third planar layer 43, thereby reducing the number of masks used in the manufacturing process of the display substrate to increase productivity and reduce cost.

In the display substrate illustrated in FIG. 7, the light shielding layer 20 can also be formed by using photosensitive resin having light transmittance being less than or equal to 10%, such as black photosensitive resin. And, In the display substrates illustrated in FIG. 8 and FIG. 9, the light shielding layer 20 can also be formed by using polyimide (PI) having light transmittance being less than or equal to 10%, such as black or dark polyimide. It will be noted that, both of the above material, photosensitive resin and polyimide, have a function of insulation. However, polyimide has a better insulation than photosensitive resin. Therefore, in a case that the light shielding layer 20 contacts directly the plurality of thin film transistors 12 in the display substrate 10 as shown in FIG. 7, a material of the light shielding layer 20 is selected as polyimide. In a case that the light shielding layer 20 contacts directly the electrode layer 50 as shown in FIG. 8, a material of the light shielding layer 20 is also selected as polyimide. In a case that the light shielding layer 20 does not contact directly the plurality of thin film transistors 12 in the display substrate 10 and the electrode layer 50 as shown in FIG. 9, a material of the light shielding layer 20 is selected as photosensitive resin.

Some embodiments of the present disclosure provide a method for manufacturing a display substrate. The display substrate has a fingerprint recognition region. Referring to FIGS. 1 to 10, the method for manufacturing the display substrate includes S100 to S300.

In S100, an array substrate 10 is manufactured.

For example, as shown in FIG. 3, the array substrate 10 includes a base substrate 11 and a plurality of thin film transistors 12 disposed on a surface of the base substrate 11. In a case where the array substrate has a structure as shown in FIG. 3, the S100 includes S101 and S102.

In S101, the base substrate 11 is provided.

In S102, the plurality of thin film transistors 12 are manufactured on the base substrate 11.

However, in a case where the array substrate 10 further includes a plurality of capacitors, the S102 further includes manufacturing the plurality of capacitors on the base substrate 11.

In S200, a light shielding layer 20 is formed at a side of the array substrate 10 by using an insulating material. The light shielding layer 20 is at least located in a fingerprint recognition region 3.

The display substrate further has a display area 2. The fingerprint recognition region 3 overlaps with the display area 2, or the fingerprint recognition region 3 is within the display area 2. However, the position of the fingerprint recognition region 3 at the display substrate can be set according to actual needs, which is not limited in some embodiments of the present disclosure. In some examples, as shown in FIG. 2, the fingerprint recognition region 3 overlaps with the display area 2. Thus, when the display substrate is applied to a display apparatus, fingerprint recognition can be performed at any position of the display area of the display apparatus, thereby improving user experience.

In addition, in some examples, at least one light-transmitting film 80 is disposed on surfaces of the plurality of thin film transistors 12 of the array substrate 10 away from the substrate 11. Forming a light shielding layer 20 at a side of the array substrate 10 by using an insulating material includes forming the light shielding layer 20 on a surface of the at least one light-transmitting film 80 away from the base substrate 11. The at least one light-transmitting film 80 is formed by using a light transmissive material, and the at least one light-transmitting film 80 includes at least one layer selected from the group consisting of a passivation layer, an insulating layer, and a planar layer.

In some other examples, forming a light shielding layer 20 at a side of the array substrate 10 by using an insulating material includes forming the light shielding layer 20 on the surfaces of the plurality of thin film transistors 12 of the array substrate 10 away from the base substrate 11. That is, the light shielding layer 20 covers on the surfaces of the plurality of thin film transistors 12 away from the substrate 11 and directly contacts with the plurality of thin film transistors 12. The light shielding layer 20 can planarize sides of the plurality of thin film transistors 12 away from the base substrate 11. Based on this, it is not necessary to make a planar layer between the light shielding layer 20 and the plurality of thin film transistors 12, so that an additional mask is not required to fabricate the planar layer, that is, the number of masks can be reduced during the manufacturing process of the display substrate, thereby increasing productivity and reducing cost.

In S300, a plurality of light transmission holes 21 are formed in a portion of the light shielding layer 20 located in the fingerprint recognition region 3 to provide transmission channels to the fingerprint imaging light 4 through each of the plurality of light transmission holes 21.

Each light transmission hole 21 is configured to provide a transmission channel to the fingerprint imaging light 4, that is, the fingerprint imaging light 4 can be transmitted through at least one light transmission hole 21 of the plurality of light transmission holes 21 to form images by using the at least one light transmission hole 21.

The method for manufacturing the display substrate in some embodiments of the present disclosure has the same beneficial effects as the display substrate in some of the foregoing embodiments, and details are not described herein again.

The insulating material for manufacturing the light shielding layer 20 in the S200 is, for example, polyimide having light transmittance being less than or equal to 10%, or photosensitive resin having light transmittance being less than or equal to 10%, however, the insulating material is not limited thereto, and other insulating materials having a light shielding property and a photosensitivity may be selected according to actual needs. Herein, the fact that the insulating material has a light shielding property means that the light transmittance of the material is less than or equal to 10% (including 0). The fact that the insulating material has a photosensitivity means that it can be patterned by exposure and development processes.

In some embodiments, forming a light shielding layer 20 at a side of the array substrate 10 by using an insulating material in the S200 includes forming the light shielding layer 20 on the surfaces of the plurality of thin film transistors 12 away from the base substrate 11 in the array substrate 10 by using polyimide having light transmittance being less than or equal to 10%. As such, it can ensure that the light shielding layer 20 has a good light shielding effect, and the light shielding layer 20 provides a light preventing protection to the array substrate 10 during the subsequent manufacturing process of the display substrate, for example, reducing the influence of illumination on the performance of the thin film transistors 12 in the array substrate 10.

Correspondingly, forming a plurality of light transmission holes 21 in a portion of the light shielding layer 20 located in the fingerprint recognition region 3 in the S300 includes forming a plurality of light transmission holes 21 in the portion of the light shielding layer 20 located in the fingerprint recognition region 3 by exposure and development process using a first mask. As such, the plurality of light transmission holes 21 are formed in the portion of the light shielding layer 20 located in the fingerprint recognition region 3 by exposure and development processes without an etching process, thus the manufacturing process is simple and convenient for manufacture. In addition, at the same time of forming a plurality of light transmission holes 21 in a portion of the light shielding layer 20 located in the fingerprint recognition region 3 in the S300, at least one via hole has also been formed in the light shielding layer 20 by the exposure and development process using the first mask. Each of the at least one via hole of the light shielding layer 20 is corresponding to a thin film transistor 12 of the array substrate 10.

In addition, in some examples, referring to FIG. 7, the method for manufacturing the display substrate further includes forming a first planar film on a surface of the light shielding layer 20 away from the array substrate 10, and patterning the first planar film by exposure and development processes using a second mask to obtain a first planar layer 41 having at least one via hole. Each of the at least one via hole of the first planar 41 is corresponding to a thin film transistor 12 of the array substrate 10.

Herein, the first planar film is an entire layer formed of an insulating material applied on the surface of the light shielding layer 20 away from the array substrate 10. In a case where a plurality of light transmission holes 21 are provided in the light shielding layer 20, a portion of the first planar film will fill the plurality of light transmission holes 21. In the first planar layer 41 obtained by patterning the first planar film, each of the via holes is configured to allow a portion of the electrode layer 50 to pass therethrough for electrical connection with a corresponding thin film transistor 12 in the array substrate 10, and each via hole in the light shielding layer 20 is configured to allow a portion of the electrode layer 50 to pass therethrough for electrical connection with a corresponding thin film transistor 12 in the array substrate 10. An orthographic projection of each via hole of the first planar 41 on the array substrate 10 overlaps with an orthographic projection of one corresponding via hole of the light shielding layer 20 on the array substrate 10, and does not overlap with an orthographic projection of any light transmission hole 21 of the light shielding layer 20 on the array substrate 10.

Since the plurality of light transmission holes 21 are provided in the light shielding layer 20, in the case where the light shielding layer 20 directly contacts with the plurality of thin film transistors 12 in the array substrate 10, the first planar layer 41 is formed at a side of the light shielding layer 20 away from the array substrate 10, and an electrode layer 50 is formed at a side of the first planar layer 41 away from the light shielding layer 20, which is possible to prevent from the electrode layer 50 shorted with the plurality of thin film transistors 12 in the array substrate 10 passing through the plurality of light transmission holes 21, that is, the two are electrically connected in a region where no electrical connection is required. In a region where the electrode layer 50 is electrically connected to any of the thin film transistors 12 of the array substrate 10, each via holes in the first planar layer 41 extends throughout the light shielding layer 20. Thus, a portion of the electrode layer 50 is electrically connected to the corresponding thin film transistor by via holes throughout the first planar layer 41 and the light shielding layer 20.

In some other embodiments, the structure of the display substrate is as shown in FIG. 8 or FIG. 9. The method for manufacturing the display substrate further includes forming a second planar film on the array substrate 10 before forming a light shielding layer 20 at a side of the array substrate 10 by using the insulating material, and patterning the second planar film by exposure and development processes using a third mask to obtain a second planar layer 42 having at least one via hole. Each of the at least one via hole of the second planar 42 is corresponding to a thin film transistor 12 of the array substrate 10. Herein, the second planar film is an entire layer formed of an insulating material applied on the array substrate 10. In the second planar layer 42 obtained by patterning the second planar film, each of the via holes is configured to allow a portion of the electrode layer 50 to pass therethrough for electrical connection with a corresponding thin film transistor 12 in the array substrate 10.

Forming a light shielding layer 20 at a side of the array substrate 10 by using an insulating material in the S200 includes forming the light shielding layer 20 on a surface of the second planar layer 42 away from the array substrate 10 by using photosensitive resin having light transmittance being less than or equal to 10%.

Since the photosensitive resin (especially black photosensitive resin) contains carbon component, the second planar layer 42 is formed on the array substrate 10 and the light shielding layer 20 is formed on the second planar layer 42 using the photosensitive resin in some embodiments of the present disclosure, which is possible to prevent from a micro short occurring in direct contact between the plurality of thin film transistors 12 in the array substrate 10 and the light shielding layer 20. In addition, the light shielding layer 20 is formed by using the photosensitive resin having light transmittance being less than or equal to 10%, which can ensure that the light shielding layer 20 has a good light shielding effect, and the light shielding layer 20 provides a light preventing protection to the array substrate 10 during the subsequent manufacturing process of the display substrate, for example, reducing the influence of illumination on the performance of the thin film transistors 12 in the array substrate 10.

Correspondingly, forming a plurality of light transmission holes 21 in a portion of the light shielding layer 20 located in the fingerprint recognition region 3 in the S300 includes forming the plurality of light transmission holes 21 in the portion of the light shielding layer 20 located in the fingerprint recognition region 3 by exposure and development processes using a fourth mask. As such, the plurality of light transmission holes 21 are formed in the portion of the light shielding layer 20 located in the fingerprint recognition region 3 by exposure and development processes without an etching process, thus the manufacturing process is simple and convenient for manufacture. In addition, at the same time of forming a plurality of light transmission holes 21 in a portion of the light shielding layer 20 located in the fingerprint recognition region 3 in the S300, at least one via hole has also been formed in the light shielding layer 20 by the exposure and development process using the fourth mask. Each of the at least one via hole of the light shielding layer 20 is corresponding to a thin film transistor 12 of the array substrate 10.

Herein, an orthographic projection of each via hole of the light shielding layer 20 on the array substrate 10 overlaps with an orthographic projection of one corresponding via hole of the second planar layer 42 on the array substrate 10. And an orthographic projection of each light-transmitting hole 21 of the light shielding layer 20 on the array substrate 10 does not overlap with an orthographic projection of any via hole of the second planar layer 42 on the array substrate 10. However, since the light shielding layer 20 is located between the second planar layer 42 and the electrode layer 50, the portions of the light shielding layer 20 corresponding to the via holes of the second planar layer 42 are also provided with via holes. Thus, a portion of the electrode layer 50 is electrically connected to the corresponding thin film transistor by via holes throughout the light shielding layer 20 and the second planar layer 42.

Referring to FIG. 9, in some embodiments, the method for manufacturing the display substrate further includes forming a third planar film 43 on the surface of the light shielding layer 20 away from the second planar layer 42, and patterning the third planar film by exposure and development processes using the third mask to obtain a third planar layer having at least one via hole. Each of the at least one via hole of the third planar 43 is corresponding to a thin film transistor 12 of the array substrate 10.

Herein, the third planar film is an entire layer formed of an insulating material applied on the surface of the light shielding layer 20 away from the second planar layer 42. In a case where a plurality of light transmission holes 21 are provided in the light shielding layer 20, a portion of the third planar film will fill the plurality of light transmission holes 21. In the third planar layer 41 obtained by patterning the third planar film, each of the via holes is configured to allow a portion of the electrode layer 50 to pass therethrough for electrical connection with a corresponding thin film transistor 12 in the array substrate 10. An orthographic projection of each via hole of the third planar 43 on the array substrate 10 overlaps with an orthographic projection of one corresponding via hole of the light shielding layer 20 on the array substrate 10, and does not overlap with an orthographic projection of any light transmission hole 21 of the light shielding layer 20 on the array substrate 10.

However, in a region where the electrode layer 50 is electrically connected to any thin film transistor 12 of the array substrate 10, the via holes in the third planar layer 43 are in communication with the corresponding via holes in the second planar layer 42. That is, the third planar layer 43 and the second planar layer 42 have the same patterns. The second planar layer 42 and the third planar layer 43 are formed by using the third mask, which can reduce the number of masks used in the manufacturing process of the display substrate, thereby increasing productivity and reducing cost.

The insulating materials used in the first flat layer 41, the second flat layer 42 and the third flat layer 43 are the same or different, which is not limited in some embodiments of the present disclosure. For example, the first flat layer 41, the second flat layer 42 and the third flat layer 43 are all formed by using light-transmissive resin.

Referring to FIGS. 1 to 9, in some embodiments, the method for manufacturing the display substrate further includes forming an electrode layer 50 at the side of the light shielding layer 20 away from the array substrate 10, and forming a plurality of openings 51 in the electrode layer 50.

An orthographic projection of each light transmission hole 21 of the plurality of light transmission holes 21 of the light shielding layer 20 on the array substrate 10 is within an orthographic projection of one opening 51 of the plurality of openings 51 on the array substrate 10.

The electrode layer 50 is usually formed by using a conductive material. In some examples, the electrode layer 50 is formed by using a metal material, and the electrode layer 50 is lightproof. That is, in the case where the electrode layer 50 is provided at the side of the light shielding layer 20 away from the array substrate 10, the electrode layer 50 needs to be hollowed out to ensure that the portion of the electrode layer 50 facing each light transmission hole 21 has an opening 51, thereby facilitating the fingerprint imaging light 4 passing through the at least one opening 51 of the electrode layer 50 into the corresponding light transmission hole(s) 21. Herein, the fact that the electrode layer 50 is lightproof means that the light transmittance of the electrode layer 50 is less than or equals to 10% (including 0), that is, the reflectance of the light after being irradiated to the electrode layer 50 is greater than or equals to 90%.

Referring to FIG. 8 and FIG. 9, in some embodiments, the method for manufacturing the display substrate further includes forming a plurality of fingerprint acquisition devices 60 at a side of the array substrate 10 away from the light shielding layer 20. Each of the plurality of fingerprint acquisition devices 60 corresponds to at least one of the plurality of light transmission holes 21 of the light shielding layer 20, and each fingerprint acquisition device 60 is configured to collect fingerprint imaging light 4 transmitting through the at least one corresponding light transmission hole 21.

Some embodiments of the present disclosure provide a plurality of fingerprint acquisition devices 60 at the side of the array substrate 10 away from the light shielding layer 20, which is beneficial to the integration of the fingerprint acquisition devices 60 in the display substrate, that is, improving the integration level of the display substrate. Therefore, in some embodiments of the present disclosure, the display substrate realizes under-screen fingerprint recognition, which is not only beneficial to compressing the size of the frame of the display substrate to achieve full screen of display products, but also ensures that the display substrate has the advantages of oil resistance, water resistance and dust resistance.

Figure 11:
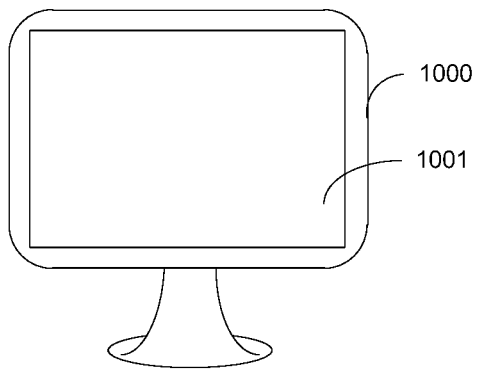
FIG. 11 is a schematic diagram of a display apparatus according to some embodiments of the present disclosure.

Some embodiments of the present disclosure provide a display apparatus. As shown in FIG. 11, the display apparatus 1000 includes a display substrate 1001 as described in some embodiments above. The display apparatus has the same beneficial effects as the display substrate described above, and details are not described herein again.

In some embodiments, the display apparatus is a display panel or a touch display panel.

For example, the display apparatus is a touch display panel with an in cell structure. A plurality of touch electrodes of the touch display panel are integrated in the display substrate, for example, a plurality of cathodes independently disposed on the display substrate are respectively reused as touch electrodes.

For example, the display apparatus is a touch display panel with an on cell structure. A touch structure of the touch display panel is integrated on a surface of the display substrate. The touch structure includes a self-capacitance touch structure or a mutual-capacitance touch structure.

For example, the display apparatus is a touch display panel with an external structure. The touch structure of the touch display panel is independent and fixed to the display substrate by bonding, clamping or the like.

In some other embodiments, the display apparatus is any product or component having a display function, such as a mobile phone, a tablet computer, a television, a laptop, a digital photo frame, an avigraph, and the like.

In the above description of the embodiments, specific features, structures, materials or characteristics may be combined in any suitable manner in any one or more embodiments or examples.

The foregoing descriptions are merely specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A display substrate having a fingerprint identification region comprising:
   an array substrate, and
   a light shielding layer disposed at a side of the array substrate and at least located in the fingerprint recognition region, wherein
   the material of the light shielding layer is an insulating material;
   a portion of the light shielding layer located in the fingerprint recognition region is provided with a plurality of light transmission holes, and each of the plurality of light transmission holes is configured to provide a transmission channel for fingerprint imaging light;
   the array substrate includes a base substrate and a plurality of thin film transistors disposed on the base substrate; and
   the light shielding layer covers on surfaces of the plurality of thin film transistors away from the base substrate, and the light shielding layer is configured to planarize sides of the plurality of thin film transistors away from the base substrate.

2. The display substrate according to claim 1, further comprising a plurality of fingerprint acquisition devices disposed at a side of the array substrate away from the light shielding layer;
   wherein each of the plurality of fingerprint acquisition devices is corresponding to at least one of the plurality of light transmission holes, and each fingerprint acquisition device is configured to collect the fingerprint imaging light transmitting through at least one corresponding light transmission hole.

3. The display substrate according to claim 1, further comprising an electrode layer disposed at a side of the light shielding layer away from the array substrate;
   wherein the electrode layer is provided with a plurality of openings, and
   an orthographic projection of each of the plurality of light transmission holes on the array substrate is within an orthographic projection of one corresponding opening of the plurality of openings on the array substrate.

4. The display substrate according to claim 3, wherein the electrode layer is lightproof.

5. The display substrate according to claim 3, wherein the thin film transistors are disposed on a surface of the base substrate facing the light shielding layer;

the electrode layer includes a plurality of first electrodes; and each of the plurality of first electrodes is electrically connected to one corresponding thin film transistor of the plurality of thin film transistors.

6. The display substrate according to claim 5, further comprising:

a luminescent material pattern disposed at a side of each first electrode away from the light shielding layer so that there are a plurality of luminescent material patterns, and a second electrode disposed at a side of each luminescent material pattern away from the first electrode so that there are a plurality of second electrodes.

7. The display substrate according to claim 6, wherein the plurality of second electrodes are electrically connected with each other, or the plurality of second electrodes have an integrated structure to form an integrated second electrode; the plurality of second electrodes are transparent, or the integrated second electrode is transparent.

8. The display substrate according to claim 3, further comprising a first planar layer disposed between the light shielding layer and the electrode layer.

9. The display substrate according to claim 1, wherein the material of the light shielding layer includes polyimide having light transmittance being less than or equal to 10%.

10. A display apparatus, comprising the display substrate according to claim 1.

11. A display substrate having a fingerprint identification region comprising:

an array substrate, a light shielding layer disposed at a side of the array substrate and at least located in the fingerprint recognition region, a second planar layer disposed between the array substrate and the light shielding layer, and a third planar layer disposed on a surface of the light shielding layer away from the second planar layer; wherein the material of the light shielding layer is an insulating material;

a portion of the light shielding layer located in the fingerprint recognition region is provided with a plurality of light transmission holes, and each of the plurality of light transmission holes is configured to provide a transmission channel for fingerprint imaging light;

the material of the light shielding layer includes photosensitive resin having light transmittance being less than or equal to 10%; and an orthographic projection of the second planar layer on the array substrate overlaps with an orthographic projection of the third planar layer on the array substrate.

12. A method for manufacturing the display substrate according to claim 11, comprising:

manufacturing an array substrate, forming a second planar film on the array substrate and patterning the second planar film, by means of a third mask, by an exposure process and a development process to obtain a second planar layer having at least one via hole, and each of the at least one via hole of the second planar layer being corresponding to a thin film transistor of the array substrate;

forming a light shielding layer at a side of the array substrate by using an insulating material and the light shielding layer being at least located in the fingerprint recognition region, forming a plurality of light transmission holes in a portion of the light shielding layer located in the fingerprint recognition region and providing a transmission channel for fingerprint imaging light by each of the plurality of light transmission holes; and forming a third planar film at a surface of the light shielding layer away from the second planar layer, and patterning the third planar film, by means of a third mask, by an exposure process and a development process to obtain a third planar layer having at least one via hole, each of the at least one via hole of the third planar layer is corresponding to a thin film transistor of the array substrate;

wherein forming a light shielding layer at a side of the array substrate by using an insulating material includes:

forming the light shielding layer on a surface of the second planar layer away from the array substrate by using photosensitive resin having light transmittance being less than or equal to 10%;

wherein forming a plurality of light transmission holes in a portion of the light shielding layer located in the fingerprint recognition region includes:

forming the plurality of light transmission holes in the portion of the light shielding layer located in the fingerprint recognition region and at least one via hole each of which is corresponding to a thin film transistor of the array substrate, by means of a fourth mask, by an exposure process and a development process;

wherein, an orthographic projection of each via hole of the second planar layer on the array substrate overlaps with an orthographic projection of each via hole of the light shielding layer on the array substrate, and does not overlap with an orthographic projection of any light transmission hole of the light-shielding layer on the array substrate; and wherein, an orthographic projection of each via hole of the third planar layer on the array substrate overlaps with an orthographic projection of each via hole of the light shielding layer on the array substrate, and does not overlap with an orthographic projection of any light transmission hole of the light-shielding layer on the array substrate.

* * * * *